(12) United States Patent
Huang (10) Patent No.: US 6,462,422 B2
(45) Date of Patent: Oct. 8, 2002

(54) INTERCROSSEDLY-STACKED DUAL-CHIP SEMICONDUCTOR PACKAGE

(75) Inventor: Chien-Ping Huang, Hsinchu Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/865,760

(22) Filed: May 25, 2001

(65) Prior Publication Data

US 2002/0096752 A1 Jul. 25, 2002

(30) Foreign Application Priority Data

Apr. 3, 2001 (TW) ........................................ 90107946 A (51) Int. Cl.$^7$ .......................... H01L 23/48; H01L 23/52; H01L 29/40
(52) U.S. Cl. ........................ 257/777; 257/686; 257/723; 438/109
(58) Field of Search ................................ 257/678, 685, 257/686, 723, 777; 438/106, 121, 109

(56) References Cited

U.S. PATENT DOCUMENTS

| | | | |
|---|---|---|---|
| 5,721,452 A | | 2/1998 | Fogal et al. ................ 257/685 |
| 6,051,886 A | * | 4/2000 | Fogal et al. ................ 257/777 |
| 6,215,193 B1 | * | 4/2001 | Tao et al. ................... 257/777 |
| 6,388,313 B1 | * | 5/2002 | Lee et al. ................... 257/686 |

* cited by examiner

Primary Examiner—David Nelms
Assistant Examiner—Andy Huynh
(74) Attorney, Agent, or Firm—Peter F. Corless; Steven M. Jensen; Edwards & Angell, LLP (57) ABSTRACT

A stacked dual-chip semiconductor packaging technology is proposed for the packaging of two semiconductor chips in one single package unit. The proposed dual-chip semiconductor package is characterized by an intercrossedly-stacked dual-chip arrangement which is constructed on a specially-designed leadframe having a supporting frame; a die pad supported on the supporting frame and having a peripheral-located upper portion and a centrally-located downset portion; and a set of leads linked to the supporting frame and arranged around the die pad. By the proposed packaging technology, a first semiconductor chip is mounted within the downset portion of the die pad, while a second semiconductor chip is mounted on the upper portion of the die pad in an intercrossedly-stacked manner in relation to the first semiconductor chip. Compared to the prior art, the propose technology allows the packaging process to be implemented in a less complex and more cost-effective manner. Moreover, since the underlying chip is attached to die pad, it allows an increased heat-dissipation efficiency to the semiconductor package.

6 Claims, 8 Drawing Sheets

INTERCROSSEDLY-STACKED DUAL-CHIP SEMICONDUCTOR PACKAGE

BACKGROUND OF THE INVENTION

1. Field of the Invention

This invention relates to semiconductor packaging technology, and more particularly, to an intercrossedly-stacked dual-chip semiconductor package and method of fabricating the same, which is designed specifically for the packaging of two semiconductor chips in one single package unit.

2. Description of Related Art to Multi-chip packaging technology is used to pack two or more semiconductor chips in one single package unit, so that one single package unit is capable of offering a manifold level of functionality or data storage capacity. Memory chips, such as flash memory chips, are typically packaged in this way so as to allow one single memory module to offer an increased data storage capacity.

Related patents, include, for example, the U.S. Pat. No. 5,721,452 entitled "ANGULARLY OFFSET STACKED DIE MULTICHIP DEVICE AND METHOD OF MANUFACTURE". This patent discloses an inventive semiconductor packaging technology that is designed for the packaging of two semiconductor chips in an offset die stacking arrangement to provide a dual-chip package.

The utilization of the foregoing patent, however, has several drawbacks. First, it requires the use of pillars to support the wire-bonding areas of the overlying chip, which would make the overall packaging process quite complex and thus costly to implement. Second, since the overlying chip is not coupled to die pad, it would make the finished semiconductor package poor in heat-dissipation efficiency. Third, since the stacked chips are adhered to each other by means of an adhesive layer, they would be easily subjected to delamination, resulting in reliability problem to the finished semiconductor package.

SUMMARY OF THE INVENTION

It is therefore an objective of this invention to provide a new dual-chip semiconductor packaging technology, which can be fabricated without having to use pillars to support the wire-bonding areas of the packaged semiconductor chips.

It is another objective of this invention to provide a new dual-chip semiconductor packaging technology, which allows the packaging process to be implemented in a less complex and more cost-effective manner.

It is still another objective of this invention to provide a new dual-chip semiconductor packaging technology, which allows the packaged semiconductor chips to have an increased heat-dissipation efficiency.

It is yet another objective of this invention to provide a new dual-chip semiconductor packaging technology, which can be implemented without having to adhere the packaged semiconductor chips to each other so as to prevent delamination problem.

In accordance with the foregoing and other objectives, the invention proposes an intercrossedly-stacked dual-chip semiconductor package and method of fabricating the same.

The semiconductor packaging technology according to the invention is characterized by an intercrossedly-stacked dual-chip arrangement which is constructed on a specially-designed leadframe having a supporting frame; a die pad supported on the supporting frame and having a peripherally-located upper portion and a centrally-located downset portion; and a set of leads linked to the supporting frame and arranged around the die pad. A first semiconductor chip is mounted within the downset portion of the die pad, while a second semiconductor chip is mounted on the upper portion of the die pad in an intercrossedly-stacked manner in relation to the first semiconductor chip.

Since the invention requires no pillars in the dual-chip structure, it allows the packaging process to be implemented in a less complex and more cost-effective manner than the prior art. Moreover, since the underlying chip is attached to die pad, it allows an increased heat-dissipation efficiency to the package. In addition, since the invention can be implemented without having to adhere the two chips to each other, it can help prevent delamination problem. The invention is therefore more advantageous to use than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The intercrossedly-stacked dual-chip semiconductor package according to the invertion is disclosed in full details by way of preferred embodiments in the following with reference to the accompanying drawings. Note that these drawings are simplified schematic diagrams showing only a small number of components related to the invention for demon-strative purpose and which are not drawn to actual sizes and scales m practical applications the practical layout on the semiconductor package may be much more-complex.

Figure 1A:
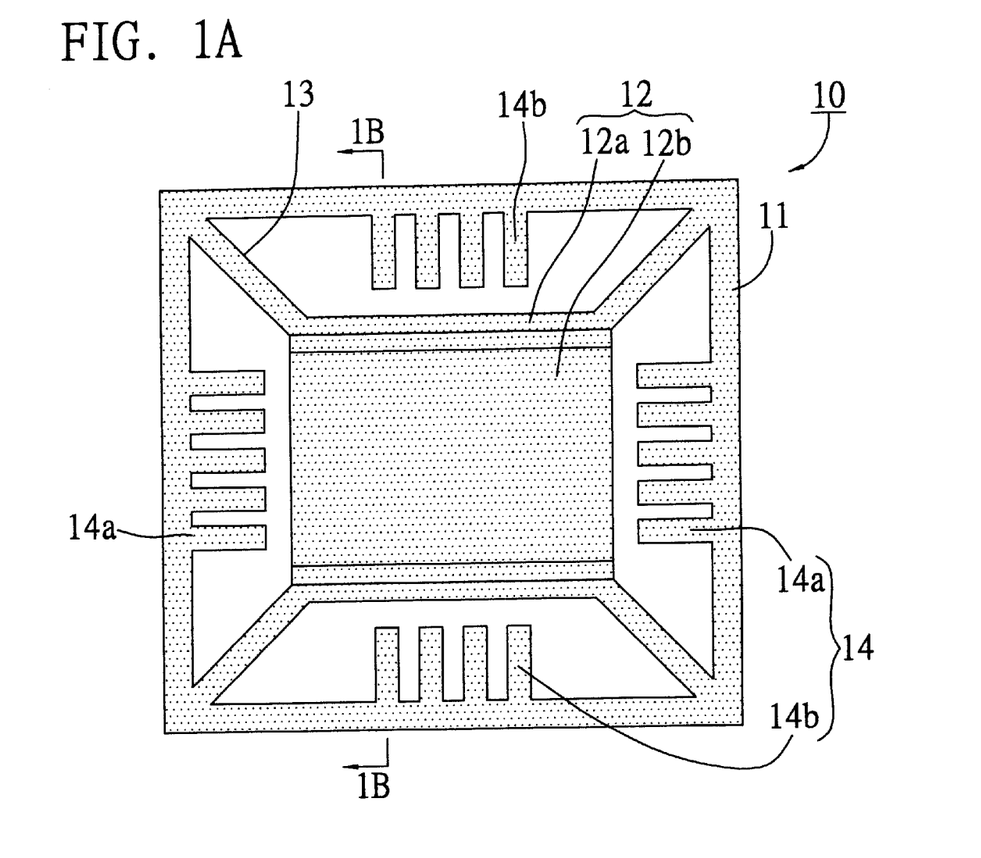
FIG. 1A is a schematic diagram showing the top view of a specially-designed leadframe utilized by the first preferred embodiment of the invention.
Figure 1B:
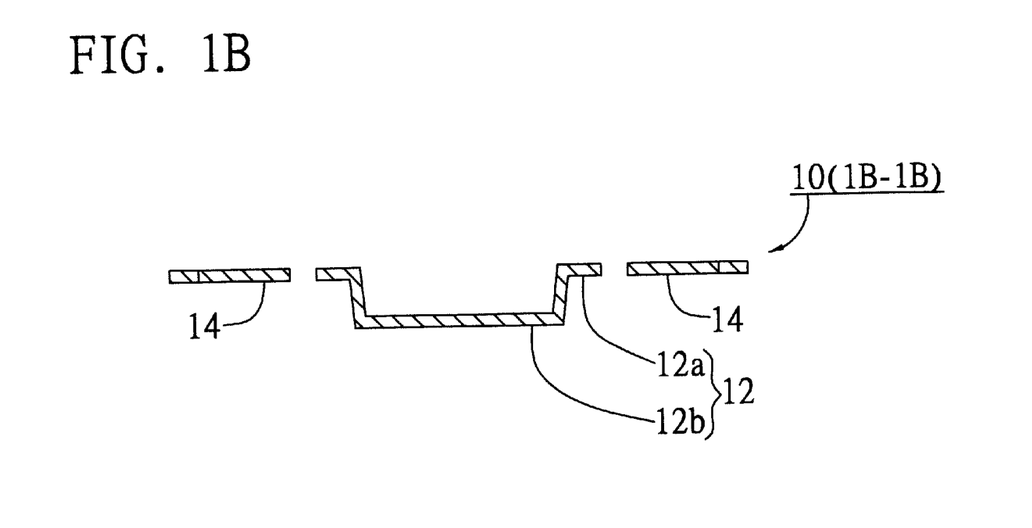
FIG. 1B shows a sectional view of the leadframe of FIG. 1A cutting through the line A–A'.

Referring to FIG. 1A and FIG. 1B, the intercrossedly-stacked dual-chip semiconductor package according to the invention is constructed on a specially signed leadframe 10, which includes: (i) a supporting frame 11; (ii) a substantially rectangularly-shaped die pad 12 having a peripherally-located upper portion 12a and a centrally-located downset portion 12b, with the upper portion 12a being linked via tie bars 13 to the supporting frame 11; and (iii) a se of leads 14 link to the supporting frame 11 and arranged around the die pad 12, including a first subset of leads 14a and a second subset of leads 14b, wherein the first subset of leads 14a are oppositely arranged on the longer sides of the rectangularly shaped die pad 12, while the second subset of leads 14b are oppositely arranged on the shorter sides of the same.

Figure 7A:
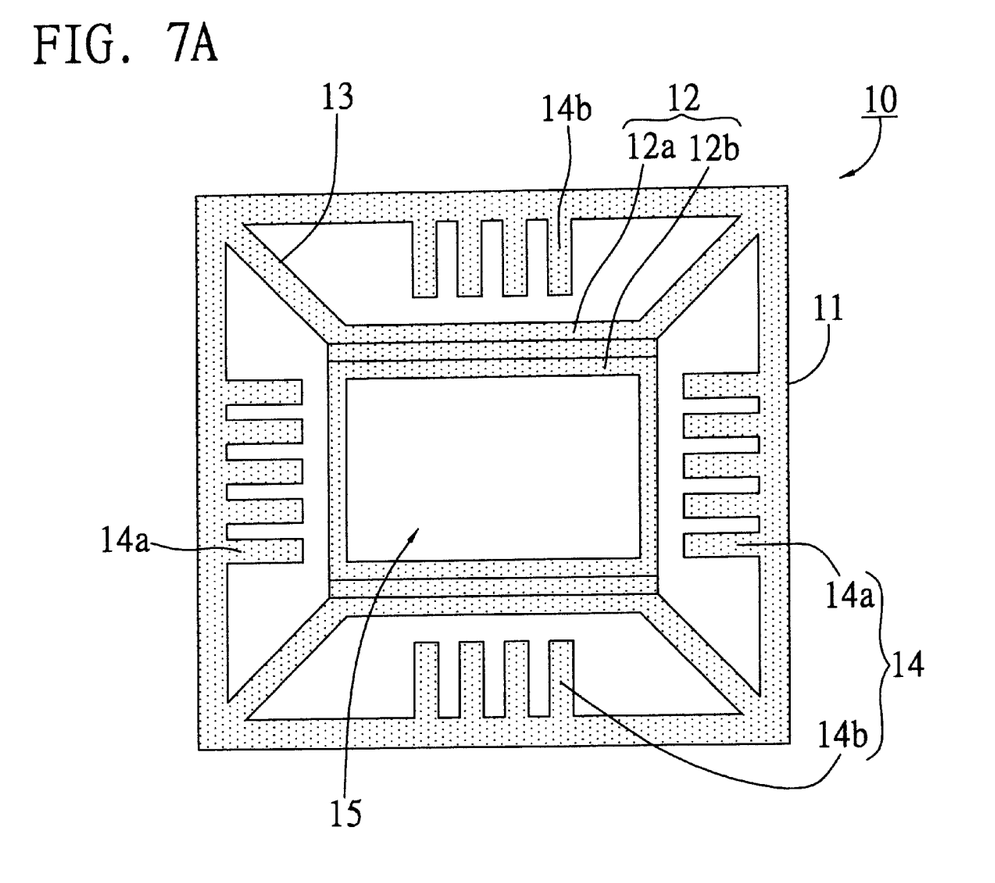
FIG. 7A is a schematic diagram showing the top view of a speciall-designed leadframe utilized by the fourth preferred embodiment of the invention.
Figure 7B:
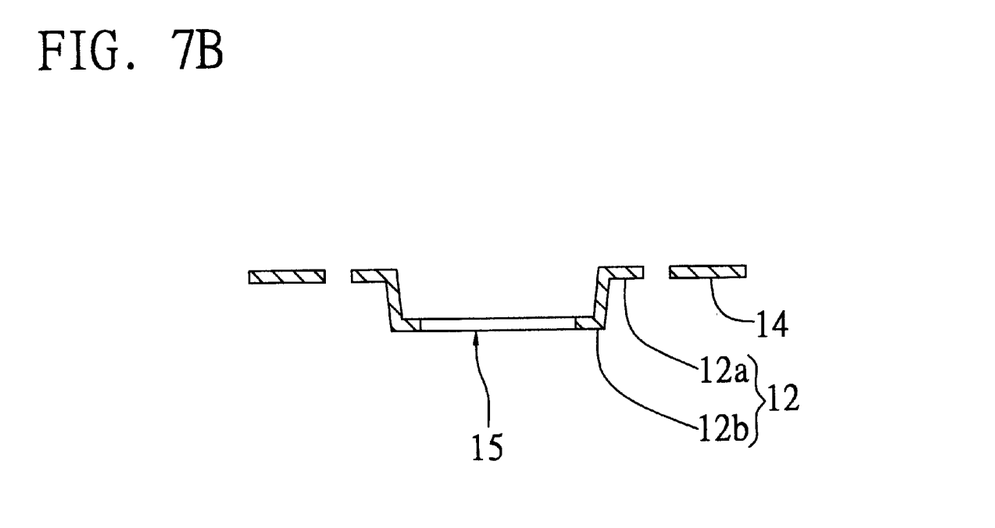
FIG. 7B shows a sectional view of the leadframe of FIG. 7A
Figure 8:
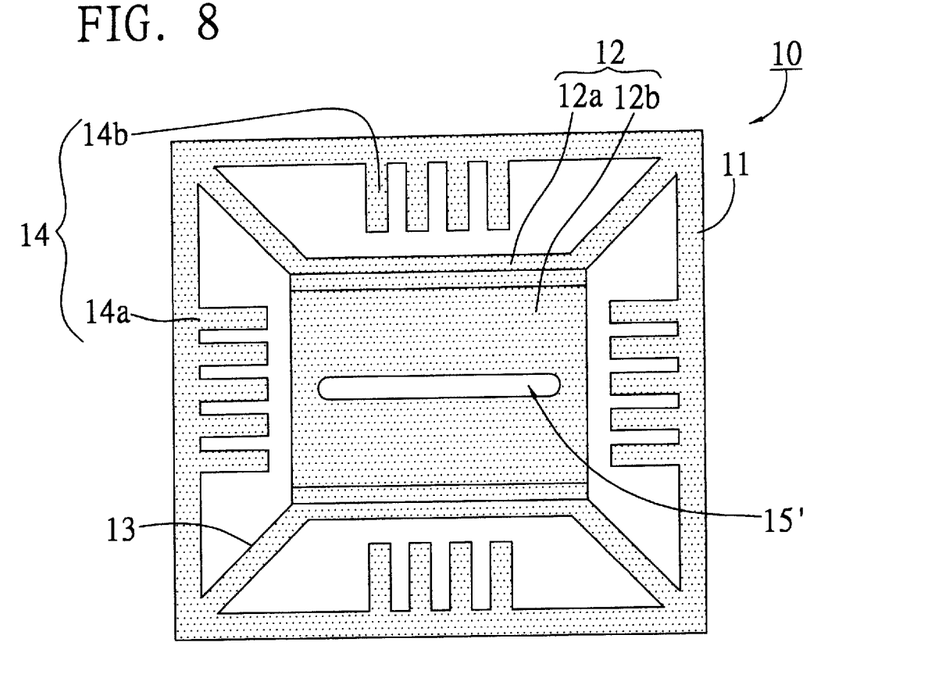
FIG. 8 is a schematic diagram showing the top view of the leadframe in the fifth preferred embodiment of the invention.
Figure 9:
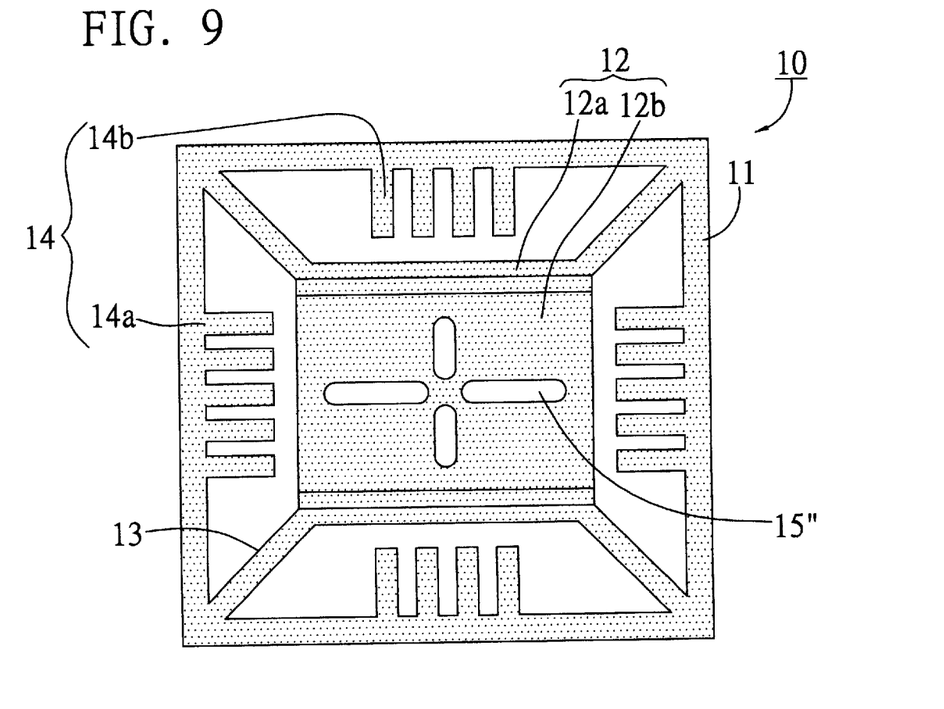
FIG. 9 is a schematic diagram showing the top view of the leadframe in the sixth preferred embodiment of the invention.

Alternatively, as illustrated in FIGS. 7A–7B, the downset portion 12b of the die pad 12 can be further formed with at least one opening 15 to help prevent delamination of a semiconductor chip (shown later in FIGS. 2A–2B with the reference numeral 20). Additionally, the opening formed on the downset portion 12b may also be either a slot 15' as shown in FIG. 8. or a slot group 15" consisting of a plurality of slots as shown in FIG. 9, so as to achieve the same effect of preventing delamination.

Figure 2A:
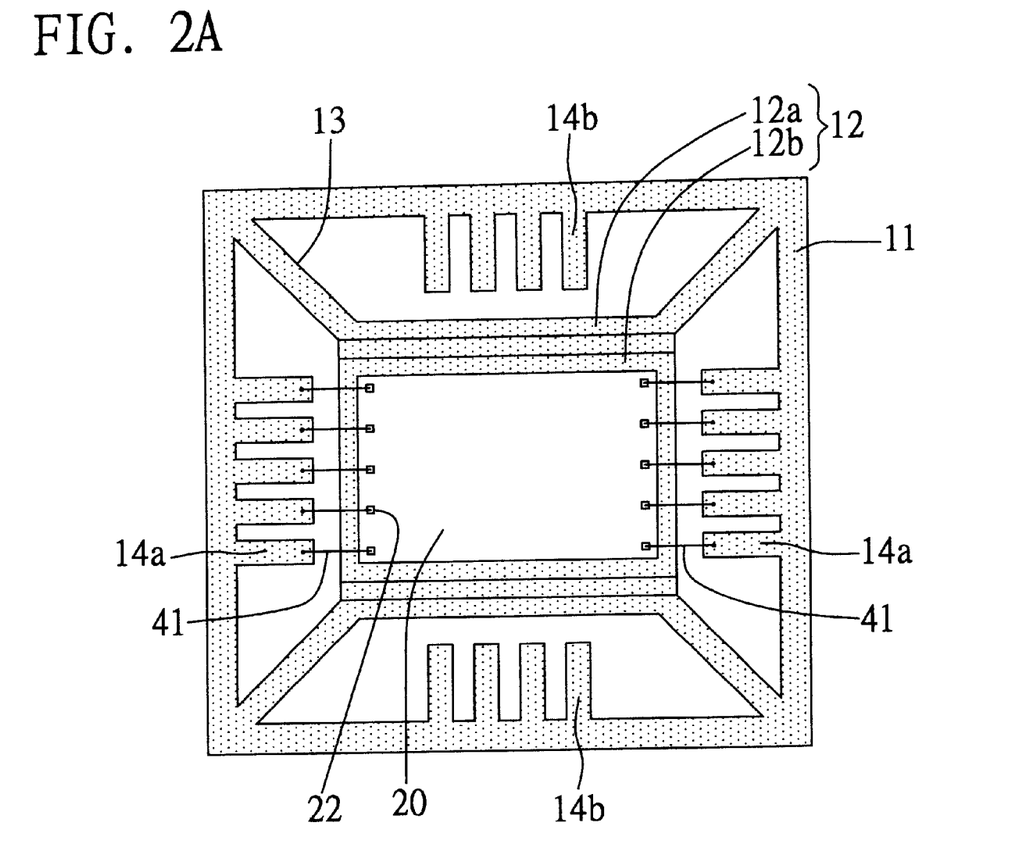
FIG. 2A shows a top view of the mounting of a first semiconductor chip on the leadframe of FIGS. 1A–1B.
Figure 2B:
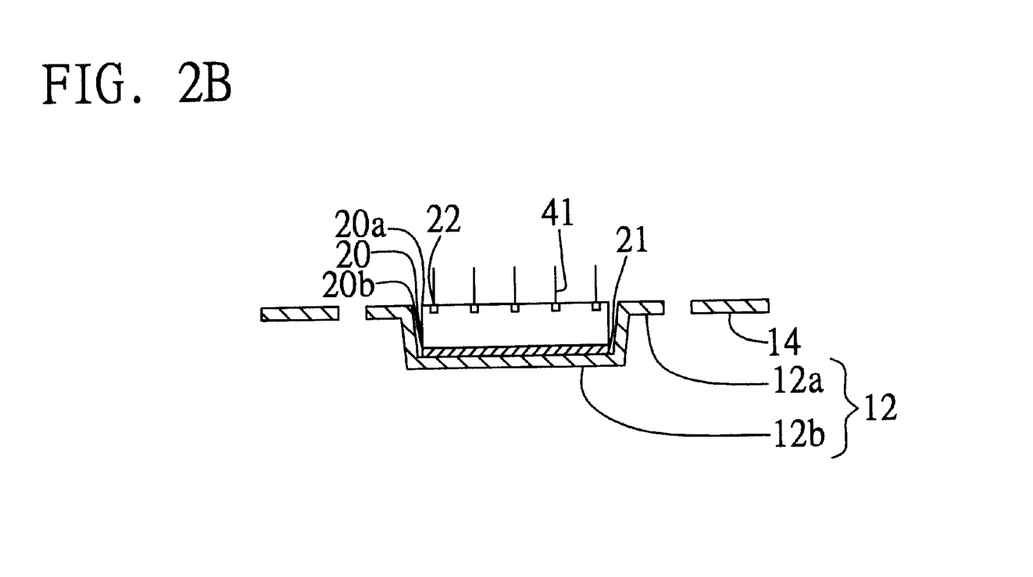
FIG. 2B shows a sectional view of the package construction of FIG. 2A.

Referring further to FIG. 2A and FIG. 2B, in the next step, a first die-attachment process is performed to mount a first semiconductor chip 20 (which has an active surface 20a and an inactive surface 20b) within the downset portion 12b of the die pad 12 by adhering its inactive surface 20b with an adhesive layer 21, such as silver epoxy, thereto.

And, the total height of the fist semiconductor chip 20 plus the adhesive layer 21 shouldn't exceed the upper portion 12a of the die pad 12 (i.e., the active surface 20a of the first semiconductor chip 20 should be lower than the upper portion 12a of the die pad 12).

Then a first wire-bonding is performed to bond a dirst set of bonding wires 41 for electically connecting respective I/O pads 22 of the first semiconductor chip 20 to the first subset of leads 14a of theset of leads 14.

Figure 3A:
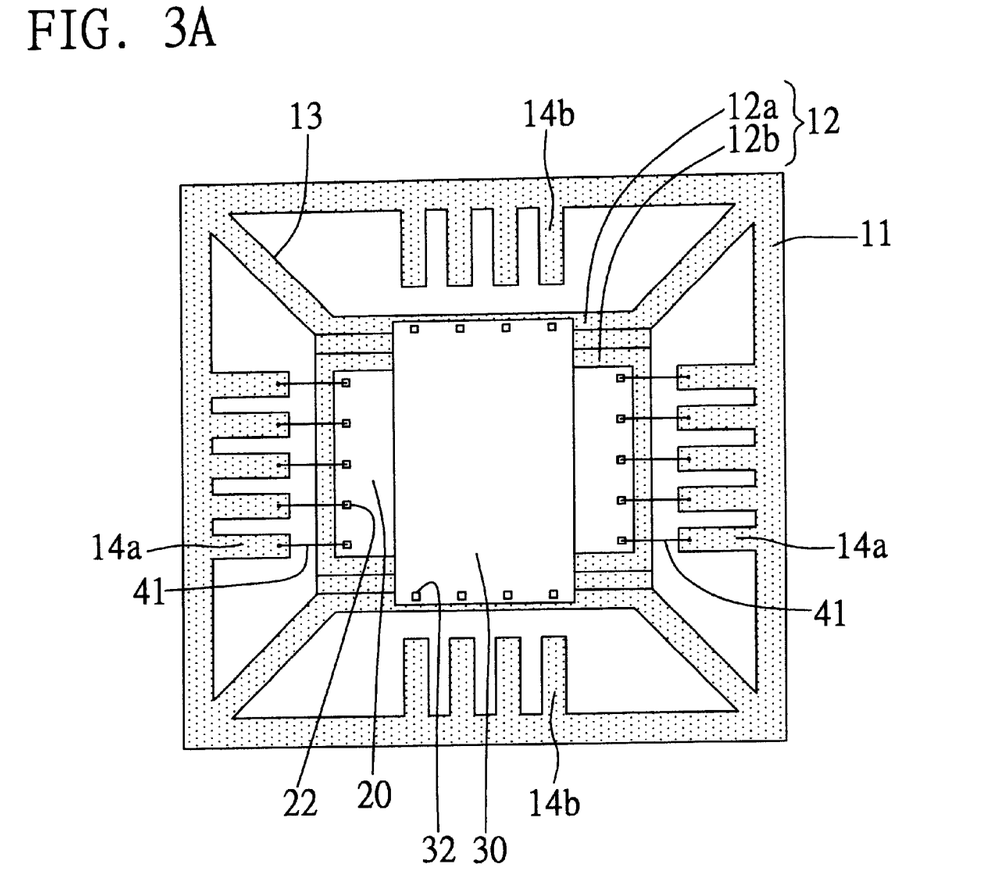
FIG. 3A shows a top view of the mounting of a second semiconductor chip on the leadframe of FIGS. 1A–1B.
Figure 3B:
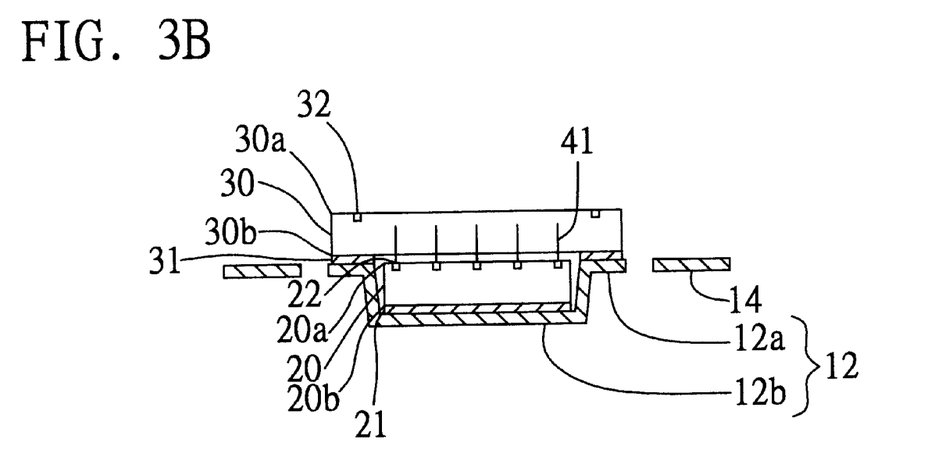
FIG. 3B shows a sectional view of the package construction of FIG. 3A.

Referring further to FIG. 3A and FIG. 3B, in the next step, a second die-attachment process is performed to mount a second semiconductor chip 30 having a size approximately same as the first semiconductor chip 20 (which has an active surface 30a and an inactive surface 30b) on the upper portion 12a of the die pad 12 by adhering its inactive surface 30b with an adhesive layer 31, such as silver epoxy, thereto and arranged in an intercrossed manner in relation to the first semiconductor chip 20. As illustrated in FIG. 3A, this die attachment results in an intercrossedly-stacked dual-chip arrangement for the two chips 20, 30 on the die pad 12.

Figure 5A:
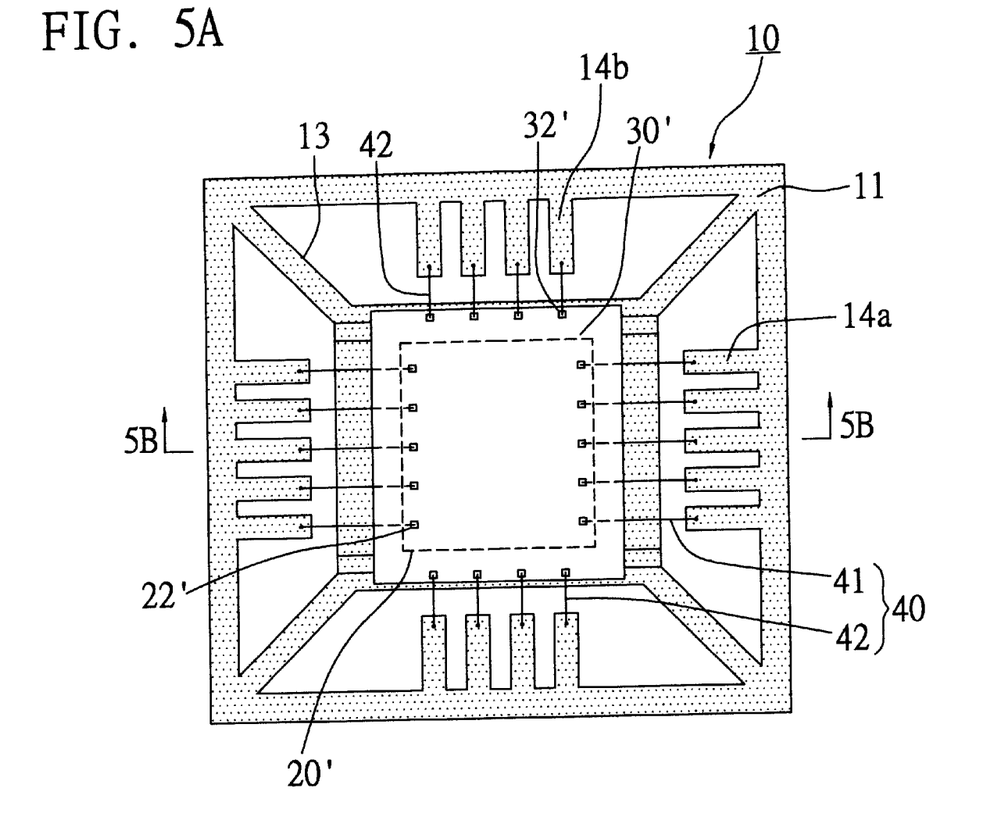
FIG. 5A is a schematic diagram showing the top, view of a specially-designed leadframe with a semiconductor chip and bonding wires mounted thereon utilized by the second preferred embodiment of the invention.
Figure 5B:
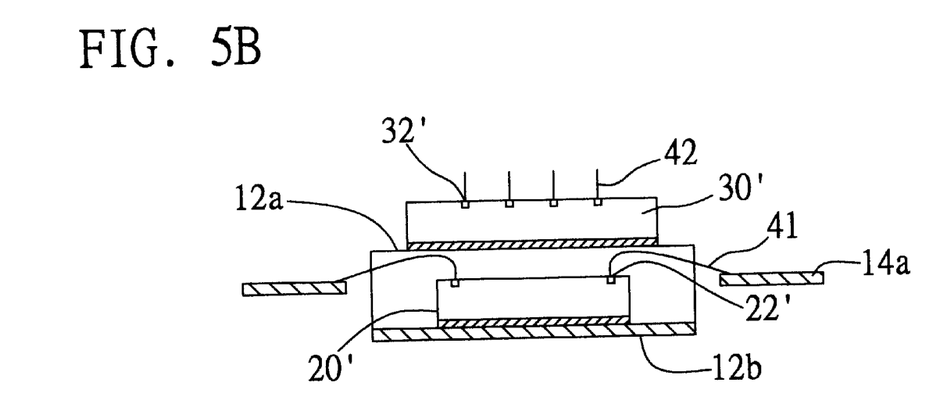
FIG. 5B shows a sectional view of the preferred embodiment of FIG. 5A cutting through the line 5B—5B.

In the aforementioned second die-attachment process, the second semiconductor chip 30 substantially rectangularly-shaped and has its the shorter sides shorter in length than the longer sides of the first semiconductor chip 20. However, another embodiment with a second semiconductor chip 30' in a size larger than a first semiconductor chip 20' is shown in FIG. 5A and FIG. 5B, wherein the first semiconductor chip 20' is mounted on the downset portion of the die pad 12. Further, the first semiconductor chip 20' has an active surface and an inactive surface, wherein the active surface is substantially in a rectangular shape with a plurality of I/O, pads 22 formed on the longer sides thereof.

Figure 4A:
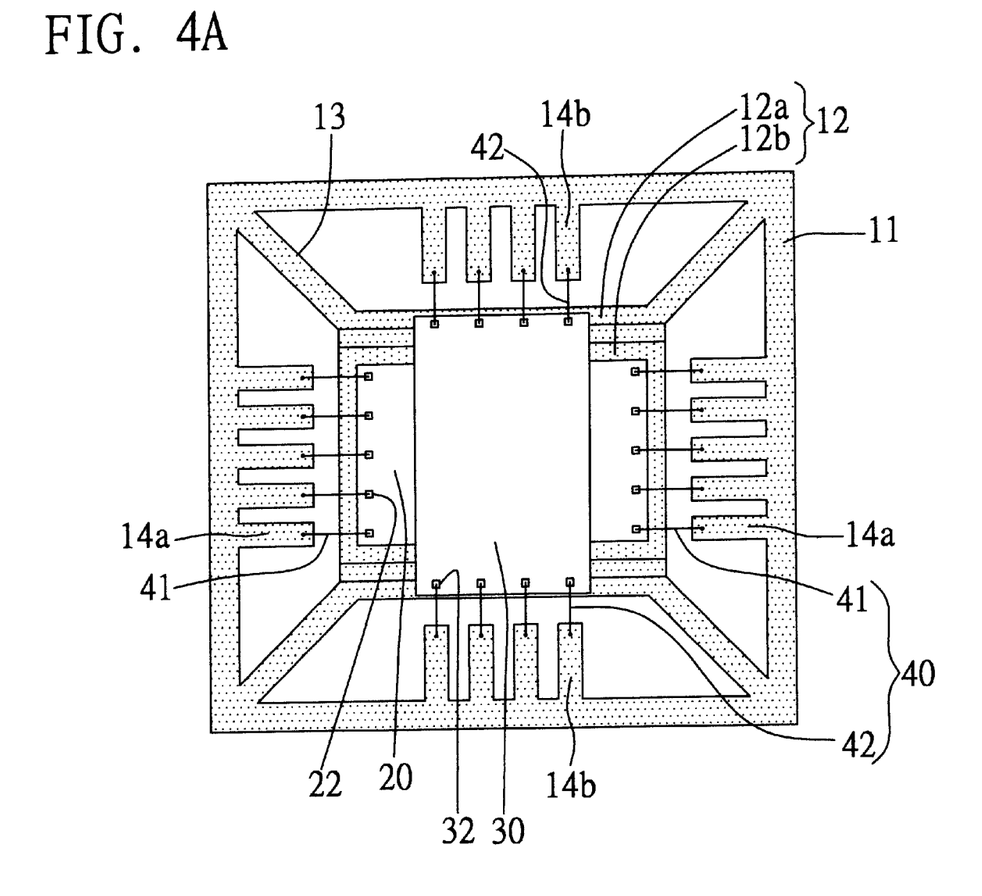
FIG. 4A shows a top view of the wire bonding on the leadframe of FIGS. 1A–1B.
Figure 4B:
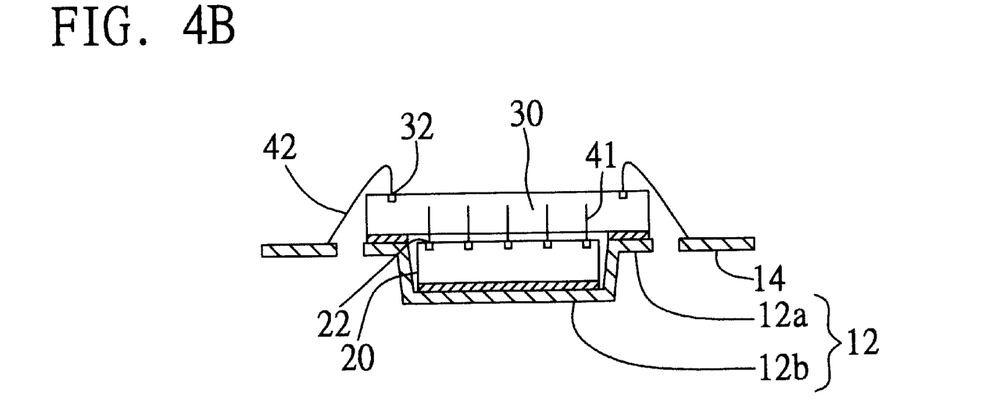
FIG. 4B shows a sectional view of the package construction of FIG. 4A.

Referring further to FIG. 4A and FIG. 4B, in the next step, a second wire-bonding process is performed to bond a second subset of bonding wires 42 for electrically connecting respectivethe I/O pads 32 of the second semiconductor chip 30 to the second subset of leads 14b. It can be seen from the illustration of FIG. 4A that, since the I/O pads 22, 32, are arranged on the shorter sides of the respective chips 20, 30, it allows both the first subset of bonding wires 41 and the second subset of bonding wires 42 to be conveniently routed to the nearby first subset of leads 14a and the second subset of leads 14b.

Figure 6:
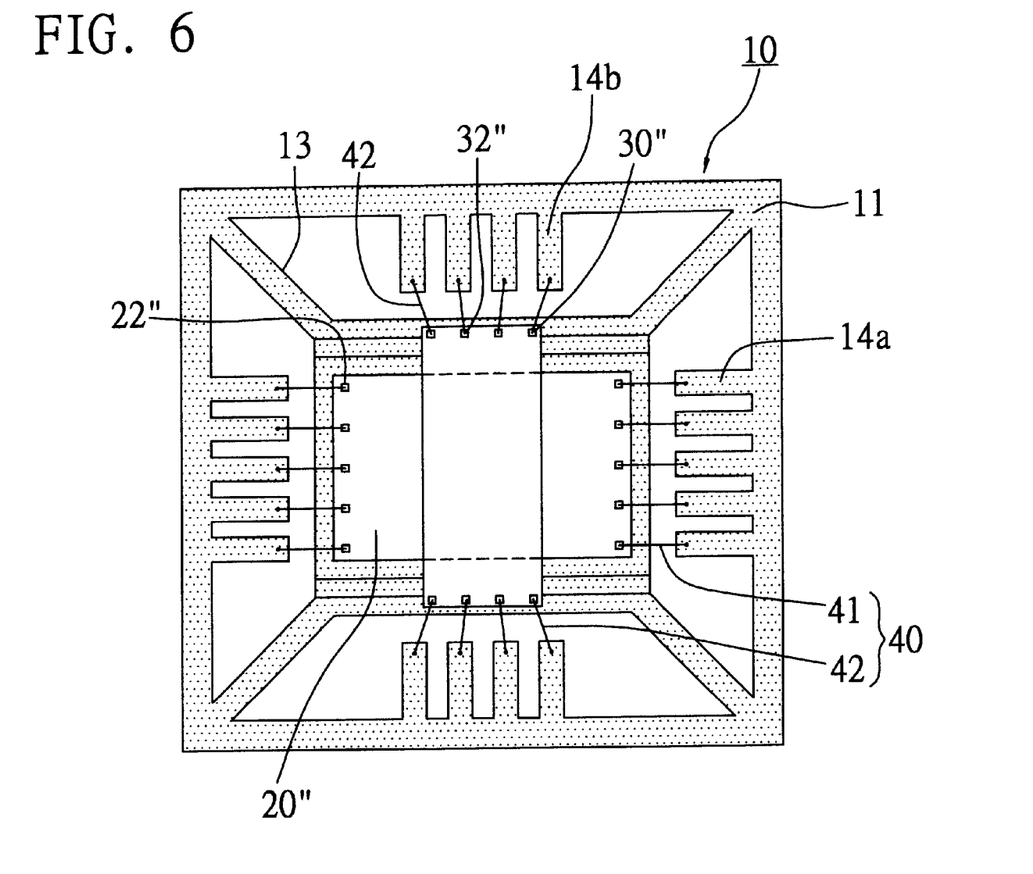
FIG. 6 is a schematic dial showing the top view of a specially-designed leadframe frame with a semiconductor chip and bonding wires mounted thereon utilized by the theird preferred embodiment of the invention.

Referring further to FIG. 5A and FIG. 5B, when the first semiconductor chip 20' has a smaller size than the second semiconductor chip 30', the dual chips can be arranged in such a manner that a spacing there between is only required to be sufficient for bonding the first set of bonding wires 41; whereas the dual-chip arrangement can be in the case as shown in FIG. 6 when a first semiconductor chip 20" is larger than a second semiconductor chip 30".

Subsequent steps to finish the semiconductor package include an encapsulation step to encapsulate the two semiconductor chips 20, 30, and a singulation step to cut away the supporting frame 11 to singulate each individual package unit. These steps are all conventional processes, so description thereof Will not be further detailed.

Additionally, besides the square-square, rectangle-rectangle or square-rectangle combination proposed in the aforementioned embodiments, the dual chips mounted on the lead frame 10 of the invention can also be in other combination's of shapes dependent on the integrated circuit design, tie singulation technique or other technical requirements Moreover, besides the intercrossedly-stacked arrangements shown in the aforementioned embodiments, the dual chips can also be in arrangement with one of the chips being rotated by an angle with respect to the other, so as to achieve the same effect of intercrossedly stacking the chips.

Compared to the prior art, since the invention requires no pillars in the dual-chip structure, it allows the packaging process to be implemented in a less complex and more cost-effective manner than the prior art. Moreover, since the underlying chip is attached to die pad, it allows an increased heat-dissipation efficiency to the package. In addition, since the invention can be implemented without having to adhere the packaged semiconductor chips to each other, it can help prevent delamination problem. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements, for example, replacing the opening or slot of the downset portion 12b of the die pad 12 by other shapes, modifying the arrangement of the slots of the slot group etc. The scope of the claims, therefore, should be accorded the broadest interpretation so as to encompass all such modifications and similar arrangements.

What is claimed is:

1. A semiconductor package, which comprises:
   (a) a leadframe, which includes:
      (a1) a die pad having a peripherally-located upper portion and a centrally-located downset portion;
      (a2) a set of leads arranged around the die pad;
   (b) a first semiconductor chip having a substantially rectangularly-shaped active surface formed with a plurality of I/O pads along the shorter sides thereof and an inactive surface adhered to the downset portion of the die pad;
   (c) a second semiconductor chip having a substantially rectangularly-shaped active surface formed with a plurality of I/O pads and an inactive surface adhered to the upper portion of the die pad and above the first semiconductor chip to form an intercrossedly-stacked dual-chip arrangement; the shorter sides of the second semiconductor chip being smaller than the longer sides of the first semiconductor chip to allow the I/O pads of the first semiconductor chip to be uncovered by the second semiconductor chip; and (d) a set of bonding wires for electrically connecting the respective I/O pads of the first and second semiconductor chips to the leads.

2. The semiconductor package of claim 1, wherein the centrally-located downset portion is formed with at least one opening to help prevent the first semiconductor chip from delamination.

3. The semiconductor package of claim 1, wherein the centrally-located downset portionof the die pad is formed with at least one slot to help prevent the first semiconductor chip from delamination.

4. The semiconductor package of claim 1, wherein the inactive surface of the first semiconductor chip is adhered to the downset portion of the die pad by means of silver epoxy.

5. The semiconductor package of claim 1, wherein the inactive surface of the second semiconductor chip is adhered to the upper portion of the die pad by means of silver epoxy.

6. The semiconductor package of claims 1, 2 or 3, wherein the bonding wires are gold wires.

* * * * *